(12) United States Patent
Inoue et al.

(10) Patent No.: US 7,820,554 B2
(45) Date of Patent: Oct. 26, 2010

(54) METHOD FOR UNLOADING THERMALLY TREATED NON-PLANAR SILICON WAFERS WITH A CONVEYING BLADE

(75) Inventors: Kazutoshi Inoue, Tokyo (JP); Naoyuki Wada, Tokyo (JP)

(73) Assignee: Sumco Corporation, Tokyo (JP)

( * ) Notice: Subject to any disclaimer, the term of this patent is extended or adjusted under 35 U.S.C. 154(b) by 270 days.

(21) Appl. No.: 11/499,404

(22) Filed: Aug. 4, 2006

(65) Prior Publication Data

US 2007/0059150 A1 Mar. 15, 2007

(30) Foreign Application Priority Data

Aug. 26, 2005 (JP) ............... 2005-245253

(51) Int. Cl.
*H01L 21/26* (2006.01)
*H01L 21/68* (2006.01)
*H01L 21/205* (2006.01)

(52) U.S. Cl. .................. 438/716; 118/500; 118/719; 118/728; 414/757

(58) Field of Classification Search .......... None
See application file for complete search history.

(56) References Cited

U.S. PATENT DOCUMENTS 3,920,492 A * 11/1975 Sugita et al. ............. 438/507

6,164,894 A * 12/2000 Cheng ................. 414/416.03
6,217,663 B1 4/2001 Inokuchi et al.
6,267,423 B1 7/2001 Marohl et al.

FOREIGN PATENT DOCUMENTS

| JP | 10-294287 | 11/1998 |
|---|---|---|
| JP | 10-294287 A | 11/1998 |
| JP | 11-054598 A | 2/1999 |

OTHER PUBLICATIONS

European Search Report dated Nov. 26, 2008.
Taiwanese Office Action dated Apr. 7, 2010, Issued in Corresponding Taiwanese Patent Application 95128863.

* cited by examiner

*Primary Examiner*—Matthew Smith
*Assistant Examiner*—Walter H Swanson
(74) *Attorney, Agent, or Firm*—Sughrue Mion, PLLC

(57) ABSTRACT

A process for producing a silicon wafer by conveying a (100) face silicon wafer into and from a treating furnace of a single wafer heat-treating apparatus or a vapor phase growth apparatus with a conveying blade having a mounting face capable of mounting only a specified region of the wafer inclusive of a center position of its rear face for subjecting the wafer to a heat treatment or a vapor phase growth, in which <010> or <001> orientation is shifted by a predetermined angle with respect to a transverse direction of the mounting face of the conveying blade.

3 Claims, 4 Drawing Sheets (a)

(b)

METHOD FOR UNLOADING THERMALLY TREATED NON-PLANAR SILICON WAFERS WITH A CONVEYING BLADE

CROSS-REFERENCE TO RELATED APPLICATION

The present application claims priority to and the benefit of the Japanese Patent Application No. 2005-245253, filed in the Japan Patent Office on Aug. 26, 2005, the entire content of which is incorporated by this reference.

BACKGROUND OF THE INVENTION

1. Field of the Invention

This invention relates to a process for producing a silicon wafer which can particularly reduce a downward bowing quantity of a portion of a wafer, which is protruded from a mounting face of a conveying blade, when the wafer is heated to a higher temperature in a treating furnace.

2. Description of the Related Art

As the conventional (100) face silicon wafer, products with a notch position indicating <011> orientation (hereinafter referred to as <011> notch product) are mainstream.

Recently, for the purpose of speeding up a device, it is started to apply products with a notch position indicating <010> or <001> orientation for using a wafer by rotating to 45 degree (hereinafter referred to as <010> notch product).

As shown in FIG. 1, the production of the (100) face silicon wafer is typically carried out by placing a (100) face wafer 3 in a treating furnace 2 of a single wafer heat-treating apparatus or a vapor phase growth apparatus 1 and then subjecting to a heat treatment or a vapor phase growth (see JP-A-10-294287).

As shown in FIG. 2, the conveying of the wafer 3 into or from the treating furnace 2 is carried out by using a conveying blade 4 having a mounting face capable of mounting only a specified region of the wafer 3 inclusive of a center position of its rear face (shadowed region S in FIG. 2).

When portions 3a of the wafer 3 protruding from the mounting face of the conveying blade 4 are heated to a high temperature in the treating furnace 2, they are thermally deformed and may bow downward from the conveying blade 4 under weight of the hanging portions of the wafer itself.

As the portions 3a of the wafer 3 are bowed downward from the conveying blade 4, when the treated wafer 3 is conveyed outward from the treating furnace 2, these bowed portions 3a may contact with members arranged around the treating furnace such as side support and the like to damage the wafer.

SUMMARY OF THE INVENTION

The inventors have made studies on the bowing quantity of the portions of the wafer protruded from the conveying blade and found out that a relationship between a transverse direction of the mounting face in the conveying blade 4 and a crystalline orientation of the silicon wafer largely affects the bowing quantity.

It is, therefore, an object of the invention to provide a process for producing a silicon wafer in which the downward bowing of portions of (100) face silicon wafer protruding from the mounting face of the conveying blade at a high temperature can be reduced by adequately shifting a predetermined crystalline orientation of the wafer from a transverse direction of the mounting face of the conveying blade to prevent damaging the wafer while unloading the wafer from the treating furnace.

According to the invention, there is the provision of a process for producing a silicon wafer by conveying a (100) face silicon wafer into and from a treating furnace of a single wafer heat-treating apparatus or a vapor phase growth apparatus with a conveying blade having a mounting face capable of mounting only a specified region of the wafer inclusive of a center position of its rear face for subjecting the wafer to a heat treatment or a vapor phase growth, in which <010> or <001> orientation is shifted by a predetermined angle with respect to a transverse direction of the mounting face of the conveying blade.

In a preferable embodiment of the invention, the predetermined angle is not less than 25° and/or a notch position of the silicon wafer is <010> or <001> orientation.

According to the invention, the downward bowing of portions of the (100) face silicon wafer protruding from the mounting face of the conveying blade at a high temperature can be reduced by adequately shifting the predetermined crystalline orientation of the wafer from the transverse direction of the mounting face of the conveying blade to prevent damaging the wafer while unloading the wafer from the treating furnace.

BRIEF DESCRIPTION OF THE DRAWINGS

The invention will be described with reference to the accompanying drawings, wherein.

DESCRIPTION OF THE PREFERRED EMBODIMENTS

Figure 1:
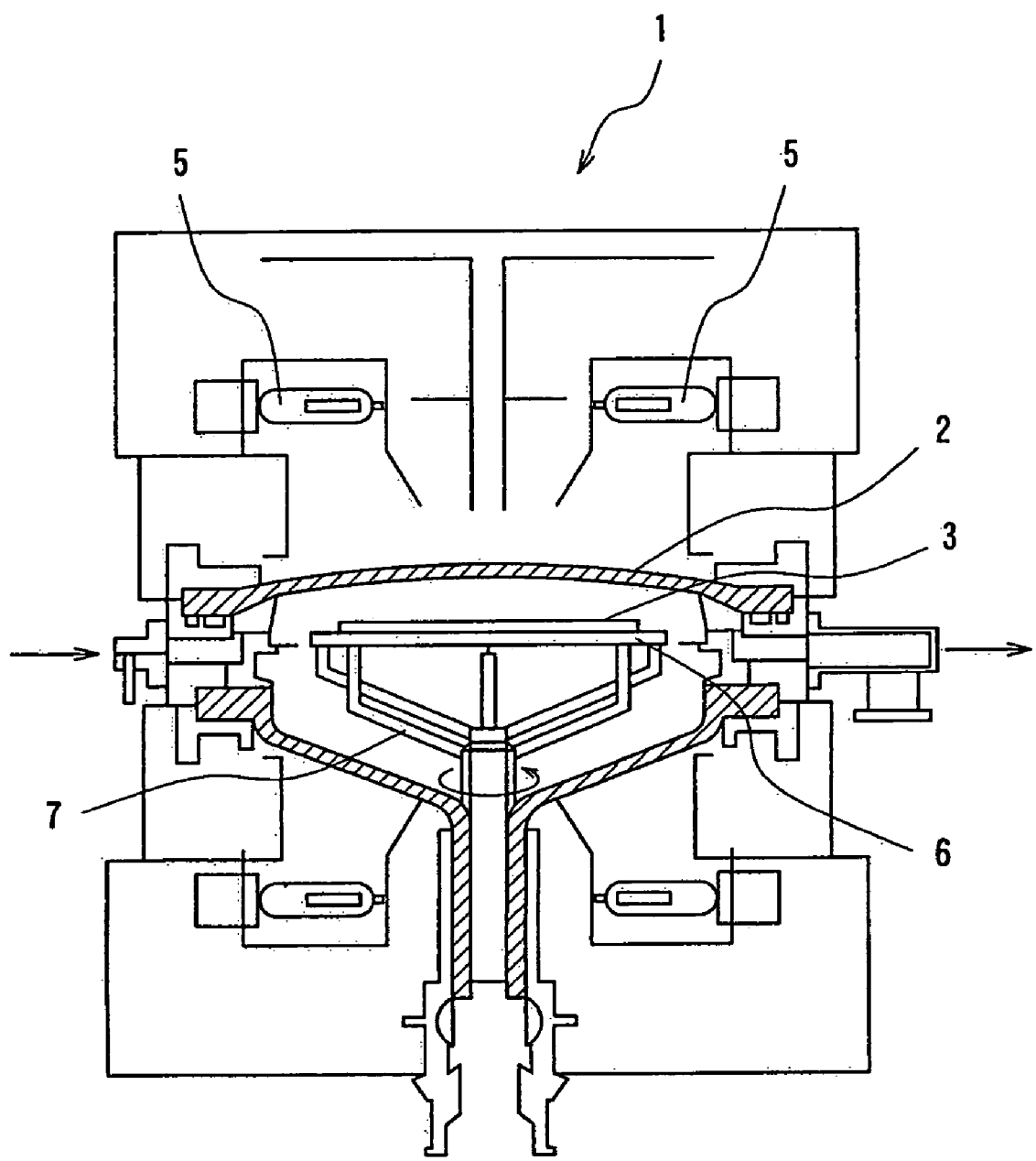
FIG. 1 is a schematic view of a vapor phase growth apparatus suitable for carrying out the process for producing a silicon wafer according to the invention.
Figure 3:
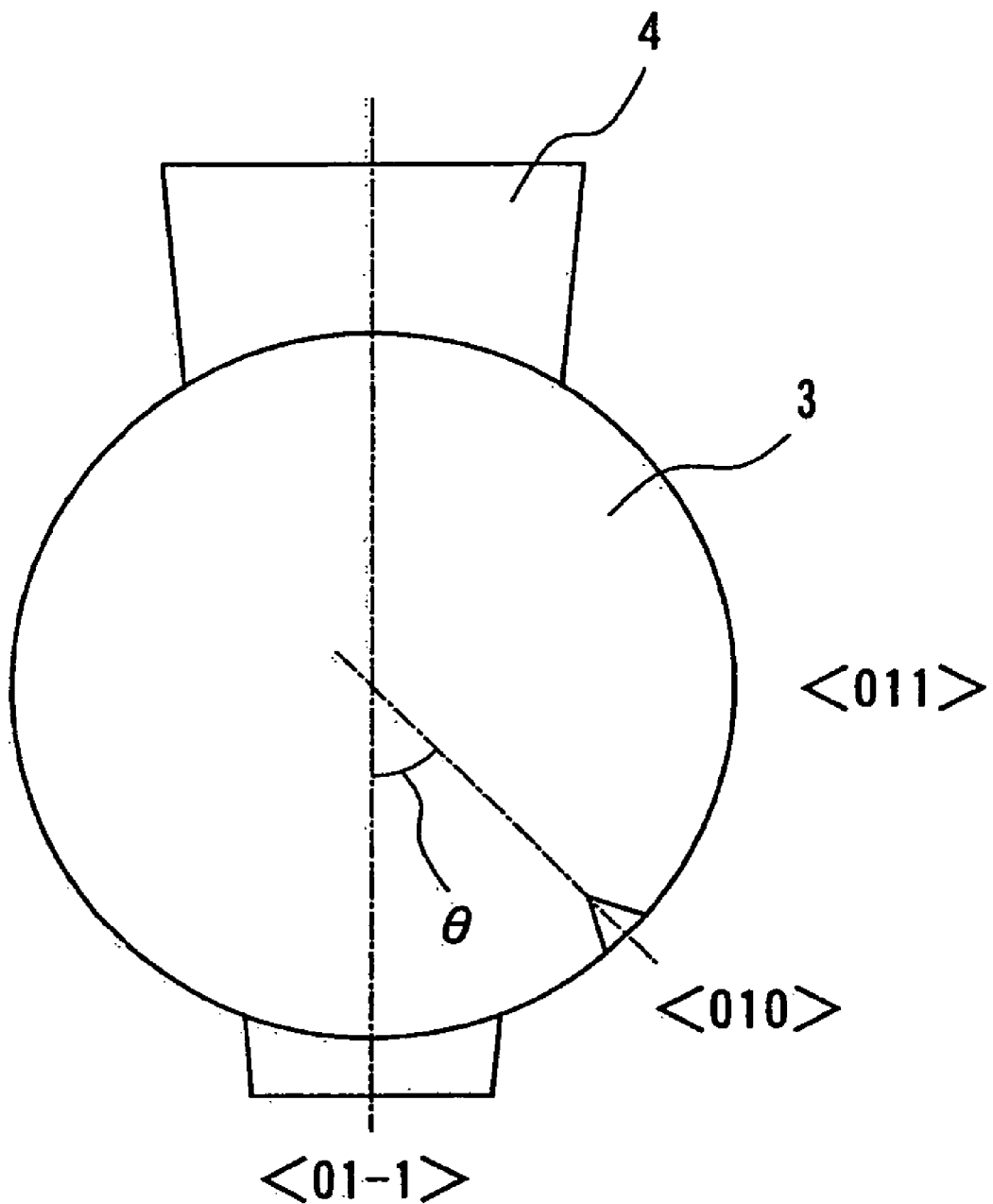
FIG. 3 is a view explaining the production process according to the invention and shows a state of conveying a silicon wafer placed on a mounting face of a conveying blade in a vapor phase growth apparatus.

In FIG. 1 is shown a vapor phase growth apparatus suitable for carrying out the process for producing a silicon wafer according to the invention, and FIG. 3 shows a state of conveying a silicon wafer placed on a mounting face of a conveying blade to a treating furnace of a vapor phase growth apparatus.

As shown in FIG. 1, the vapor phase growth apparatus 1 mainly comprises a treating furnace (reaction furnace) 2 for forming an epitaxially grown thin film of a single crystal on a silicon wafer 3, a heating means 5 for heating the wafer 3 in the film formation such as a lamp or the like, a susceptor 6 arranged in the treating furnace 2 and supporting the wafer 3 in the film formation, a conveying blade 4 for conveying the wafer 3 into or from the treating furnace 2, and a lift pin 7 for guiding the movement of the wafer 3 from the conveying blade 4 to the susceptor 6 through lifting operation.

A main feature in the construction of the invention lies in that the predetermined crystalline orientation of the (100) face silicon wafer is adequately shifted from the transverse direction of the mounting face of the conveying blade. More concretely, the <010> or <001> orientation is shifted by the predetermined angle .theta., preferably not less than 25.degree. with respect to the transverse direction of the mounting face of the conveying blade 4 as shown in FIG. 3. By adopting this feature, the downward bowing of portions of the wafer protruded from the mounting face of the conveying blade at higher temperatures can be reduced to prevent damaging the treated wafer while unloading the treated wafer from the reaction furnace.

The inventors have obtained such a knowledge that the portions of the wafer protruded from the conveying blade may be bowed downward from the conveying blade or may not be bowed when the treated wafer is placed on the conveying blade and conveyed outward from the treating furnace. Now, the inventors have made further studies and found that it is enough to set an angle defined between the extending direction of the mounting face of the conveying blade and the specified crystalline orientation of the wafer to an adequate range, and as a result the invention has been accomplished.

Figure 2:
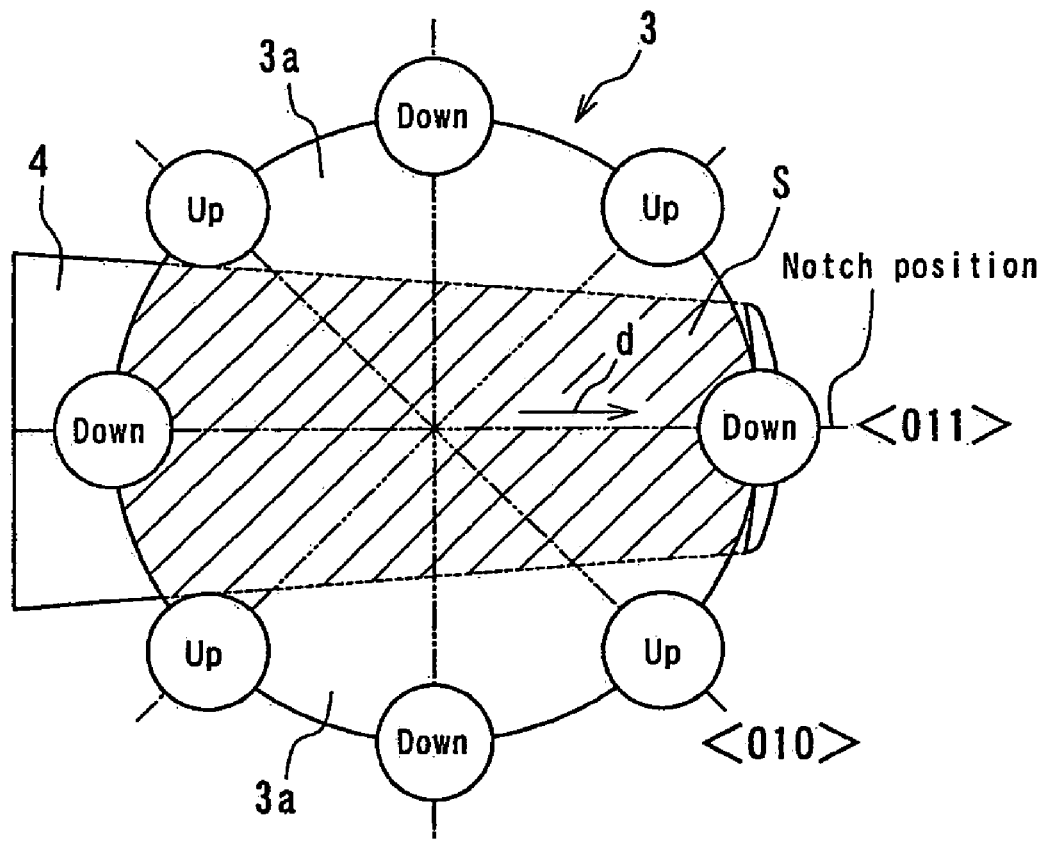
FIG. 2 shows a state of placing a wafer heated in a treating furnace on a conveying blade so as to meet <011> orientation of <010> notch product with a transverse direction d of the conveying blade, wherein (a) is a plan view and (b) is a side view.
Figure 2:
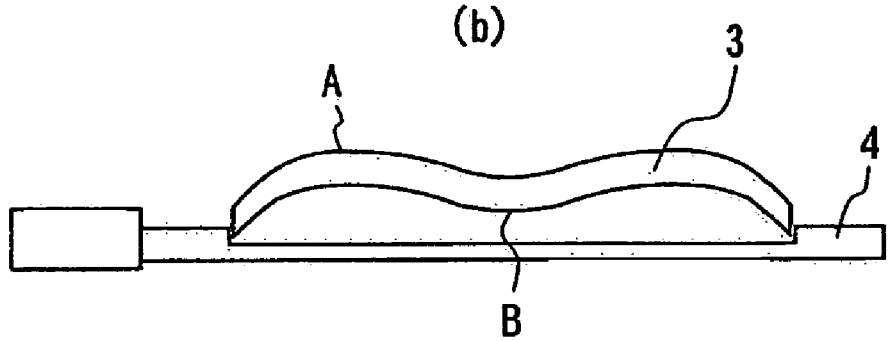
Figure 4:
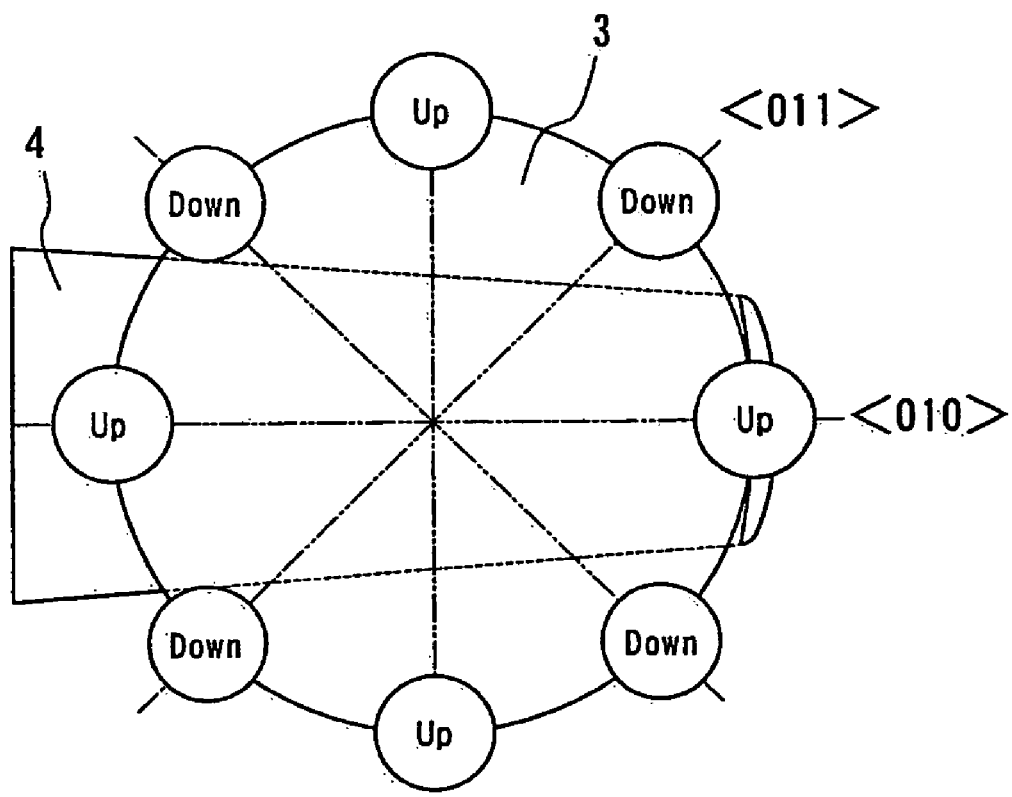
FIG. 4 shows a state of placing a wafer heated in a treating furnace on a conveying blade so as to meet <010> orientation of <010> notch product with a transverse direction d of the conveying blade, wherein (a) is a plan view and (b) is a side view.
Figure 4:
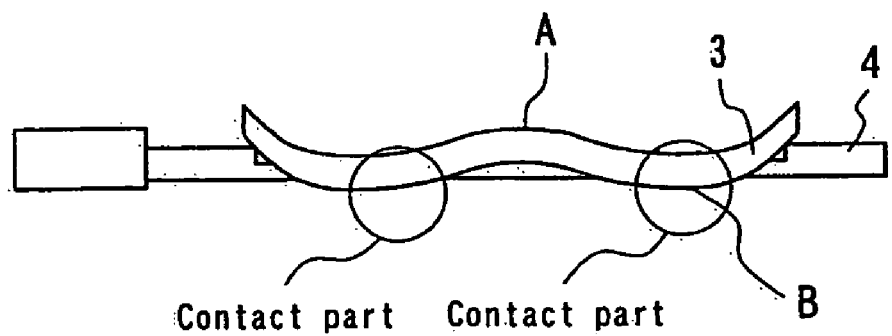

FIGS. 2(a) and (b) show a state of placing the wafer 3 heated in the treating furnace on the conveying blade 4 so as to meet <011> orientation of <010> notch product with the extending direction of the mounting face (direction d) of the conveying blade 4, and FIGS. 4(a) and (b) show a state of placing the wafer 3 heated in the treating furnace on the conveying blade 4 so as to meet <010> orientation of <010> notch product with the transverse direction d of the conveying blade 4. Each of FIGS. 2(a) and 4(a) is a plan view, and each of FIGS. 2(b) and 4(b) is a side view. Moreover, "up" and "down" shown in FIGS. 2(a) and 4(a) mean positions corresponding to mount position A and valley position B, respectively, when the wafer is thermally deformed to bow wavy.

The <011> notch product shown at the placing state in FIG. 2(a) has a side face form that both ends of the wafer located on the mounting face are bowed downward and positioned on the mounting face as shown in FIG. 2(b), so that the portions of the wafer protruded from the mounting face of the conveying blade are not bowed downward from the conveying blade.

On the other hand, the <010> notch product shown at the placing state in FIG. 4(a) has a side face form that both ends of the wafer located at the mounting face are bowed upward from the mounting face as shown in FIG. 4(b). In this case, each middle part (corresponding to valley position B) located between the end position and the center position of the wafer in the portions of the wafer protruded from the mounting face of the conveying blade as shown in FIG. 4(b) is bowed downward from the conveying blade 4. In FIG. 4(b), contact parts mean that the bowed parts of the wafer 3 contact with the side edge of the conveying blade 4.

In the invention, therefore, the predetermined crystalline orientation of the (100) face silicon wafer is adequately shifted from the transverse direction of the mounting face of the conveying blade, and more concretely <010> or <001> orientation is shifted by the predetermined angle θ with respect to the transverse direction of the mounting face of the conveying blade as shown in FIG. 3, whereby there can be prevented the formation of such a side face form that both ends of the wafer located on the mounting face are bowed upward as shown in FIG. 4(b). That is, the downward bowing quantity of the portions of the wafer protruded from the mounting face of the conveying blade can be made small (e.g. not more than 5 mm).

Although the above is described with respect to one embodiment of the invention, various modifications may be carried out within the scope of the invention.

According to the invention, the downward bowing of the portions of (100) face silicon wafer protruding from the mounting face of the conveying blade at higher temperatures can be reduced by adequately shifting a predetermined crystalline orientation of the wafer from the transverse direction of the mounting face of the conveying blade to prevent damaging the wafer while unloading the wafer from the treating furnace.

What is claimed is:

1. A process for producing a silicon wafer, the process comprising:
    placing a (100) face silicon wafer having a first end and a second end on a conveying blade having a mounting face capable of mounting only a specified region of the (100) face silicon wafer inclusive of a center position of a rear face of the (100) face silicon wafer, the placing setting an angle defined between an axial direction of the mounting face of the conveying blade and <010> or <001> crystalline orientation of the (100) face silicon wafer in a range of 25 to 65 degrees inclusive for heating the (100) face silicon wafer in a treating furnace; and
    conveying the (100) face silicon wafer outward from the treating furnace in a state such that the (100) face silicon wafer has a side face form wherein both ends of the (100) face silicon wafer located on the mounting face are bowed downward, such that portions of the (100) face silicon wafer protruding from the mounting face of the conveying blade are not bowed downward from the conveying blade.

2. A process for producing a silicon wafer according to claim 1, wherein the (100) face silicon wafer has a notch position at <010> or <001> crystalline orientation of the (100) face silicon wafer.

3. A process for producing a silicon wafer according to claim 1, wherein the (100) face silicon wafer is placed on the conveying blade so as to meet <011> orientation of <010> notch product with the axial direction of the mounting face of the conveying blade.

* * * * *